(12) United States Patent
Khatib et al.

(10) Patent No.: US 10,901,009 B2
(45) Date of Patent: Jan. 26, 2021

(54) POWER DETECTOR FOR RADIOFREQUENCY POWER AMPLIFIER CIRCUITS

(71) Applicant: GOODIX TECHNOLOGY INC., San Diego, CA (US)

(72) Inventors: Rami Khatib, San Diego, CA (US); Ahmed Emira, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 150 days.

(21) Appl. No.: 16/281,105

(22) Filed: Feb. 21, 2019

(65) Prior Publication Data

US 2020/0271699 A1 Aug. 27, 2020

(51) Int. Cl.
| | |
|---|---|
| G01R 19/00 | (2006.01) |
| H03F 3/45 | (2006.01) |
| H03F 3/21 | (2006.01) |

(52) U.S. Cl.
CPC ......... *G01R 19/0038* (2013.01); *H03F 3/211* (2013.01); *H03F 3/4508* (2013.01)

(58) Field of Classification Search
None
See application file for complete search history.

(56) References Cited

U.S. PATENT DOCUMENTS

| | | |
|---|---|---|
| 4,370,622 A | 1/1983 | Hornbeck et al. |
| 4,549,146 A | 10/1985 | Cowans et al. |
| 5,539,779 A | 7/1996 | Nagahori |
| 6,160,449 A | 12/2000 | Klomsdorf et al. |

(Continued)

FOREIGN PATENT DOCUMENTS

| | | |
|---|---|---|
| CN | 101308172 A | 11/2008 |
| CN | 101477147 A | 7/2009 |
| JP | S59185437 A | 10/1984 |

OTHER PUBLICATIONS

International Search Report dated Nov. 27, 2019 in the corresponding international application (application No. PCT/CN2019/105788).
European search report dated Dec. 14, 2020 (corresponding European reference No. 452020120).

\* cited by examiner

*Primary Examiner* — Jermele M Hollington
(74) *Attorney, Agent, or Firm* — Kilpatrick Townsend & Stockton LLP

(57) ABSTRACT

Techniques are described for power detection of an amplified signal. For example, power detection described herein can receive an amplified signal from a power amplifier, and can generate an output signal that can be fed back to help regulate an output level of the power amplifier. Embodiments receive the amplified signal can be received by a transistor. A first measurement can be obtained at the transistor's emitter corresponding to an average bias level of the amplified signal, and a second measurement can be obtained at the transistor's base. The output signal can be generated as a function of a difference between the two measurements. Some embodiments further compensate for a measured effective diode voltage corresponding to a base-emitter voltage. Such an approach can generate the power detector output signal to be independent of the β of the transistor, and therefore less affected by variations in process corners and temperature.

20 Claims, 6 Drawing Sheets

(56) References Cited

U.S. PATENT DOCUMENTS

| | | |
|---|---|---|
| 2003/0107433 A1 | 6/2003 | Arai et al. |
| 2006/0017582 A1* | 1/2006 | Lockhart ............ G01R 31/3648 340/636.1 |
| 2009/0108832 A1 | 4/2009 | Kim et al. |
| 2014/0085007 A1* | 3/2014 | Hadji-Abdolhamid ...................... H03F 3/45475 330/297 |
| 2015/0042406 A1 | 2/2015 | Kovac et al. |
| 2018/0131333 A1* | 5/2018 | Cabanillas .............. H03F 3/189 |

POWER DETECTOR FOR RADIOFREQUENCY POWER AMPLIFIER CIRCUITS

FIELD OF THE INVENTION

The present invention relates generally to power amplifier circuits. More particularly, embodiments of the present invention relate to power detector circuits for use with radiofrequency power amplifier circuits.

BACKGROUND OF THE INVENTION

Power amplifiers are common in many electronics applications. For example, radiofrequency transmitters often include power amplifiers to add a particular amount of gain to a signal prior to transmission. In many such applications, it is important to maintain a fairly constant gain (i.e., a fairly constant output power). However, the output power produced by power amplifiers can often vary with respect to process corners, temperature, and/or other factors. In many contexts, such as at high power levels, an output power variation of even a few decibels can be unacceptable. For example, such an output power variation can fail to meet certain specifications. As such, it can often be desirable to minimize such power variations at the output of power amplifiers.

In some applications, a power detector is used to sense (e.g. estimate) the power output of the power amplifier, and to provide a feedback signal that seeks to reduce the output power variations. Particularly in context of high power levels, signal variations at the output of a power amplifier can be appreciably large (e.g. ±3 volts, or 6 volts peak-to-peak). In such cases, it may not be practical to implement power detectors using certain types of transistors (e.g., complementary metal oxide semiconductor, CMOS), at least because of incompatibilities between such transistors and the high signal levels. Instead, power detectors are typically implemented in those contexts using diodes. While such circuits often work well when designed using ideal diodes, certain non-ideal characteristics of diodes, as implemented in silicon, can limit the ability of the circuits to work over variations in process corners, temperature, etc.

BRIEF SUMMARY OF THE INVENTION

Embodiments include circuits, devices, and methods for power detection of an amplified signal. Some embodiments operate in context of a radiofrequency amplifier that adds an amount of gain to a radiofrequency signal. The power detection described herein can receive the amplified signal and generate a power detector output signal, which can be fed back to help regulate the output level of the power amplifier. For example, the amplified signal can be received by a transistor. A first measurement can be obtained at the transistor's emitter corresponding to an average bias level of the amplified signal, and a second measurement can be obtained at the transistor's base. The power detector output signal can be generated as a function of a difference between the two measurements. In some embodiments, the power detector output signal is generated further to compensate for a measured effective diode voltage corresponding to a voltage drop between the emitter and base. Such an approach can generate the power detector output signal to be independent of the $\beta$ of the transistor, and therefore less affected by variations in process corners and temperature.

According to one set of embodiments, a power detector system is provided. The system includes: a signal input node to receive an amplified signal; a transistor having a base terminal, an emitter terminal, and a source terminal, the emitter terminal coupled with the signal input node; a filter having a filter input node and a filter output node, the filter input node coupled with the emitter node to generate a filter output signal at the filter output node that corresponds to an average bias level of the amplified signal; and an output generator having a first generator input node coupled with the base terminal, a second generator input node coupled with the filter output node, and a generator output node to output a power detector output signal generated as a function of a difference between the first generator input node and the second generator input node. Some such embodiments further include a diode voltage compensator to generate, at a compensator output node, a compensator output signal that is an effective diode voltage corresponding to a voltage drop between the emitter terminal and the base terminal, wherein the output generator comprises a third generator input node coupled with the compensator output node, and the power detector output signal is generated further as a function of the compensator output signal, such that the power detector output signal corresponds to a peak voltage level of the amplified signal. Some such embodiments include a radiofrequency transmitter system having a power amplifier coupled with the power detector system, wherein the power amplifier generates the amplified signal by applying an amount of gain to a radiofrequency signal, the amount of gain regulated at least partially in accordance with the power detector output signal.

According to another set of embodiments, a method is provided for power detection of an amplified signal. The method includes: receiving an amplified signal by a transistor; filtering the amplified signal, as measured at an emitter terminal of the transistor, to obtain an average bias level of the amplified signal; measuring a base voltage signal at a base terminal of the transistor; and generating a power detector output signal as a function of a difference between the average bias level and the base voltage signal. Some such embodiments further include generating a compensator output signal that is an effective diode voltage (VD) corresponding to a voltage drop between the emitter terminal and the base terminal, wherein generating the power detector output signal further comprises compensating for VD as a function of the compensator output signal, such that the power detector output signal corresponds to a peak voltage level (VP) of the amplified signal.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
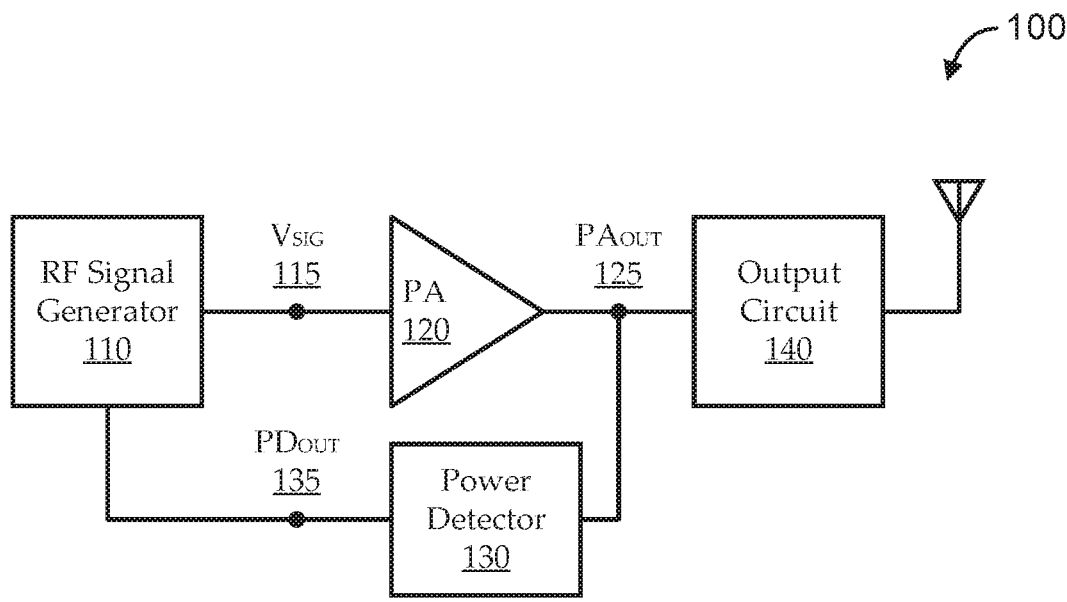
FIG. 1 shows an example of a block diagram of a partial transmitter circuit that includes a power amplifier and a power detector.

Power amplifiers are common in many electronics applications. In some such applications, a power detector is used to sense (e.g. estimate) the power output of the power amplifier, and to provide a feedback signal that seeks to reduce the output power variations. For example, FIG. 1 shows an example of a block diagram of a partial transmitter circuit 100 that includes a power amplifier 120 and a power detector 130. In the illustrated transmitter circuit 100, a radiofrequency signal generator 110 generates a modulated signal ($V_{SIG}$) 115. The power amplifier 120 adds gain to the modulated signal 115, thereby generating an amplified signal ($PA_{OUT}$) 125. The amplified signal 125 is prepared for transmission by an output circuit 140. For example, the output circuit 140 includes one or more filters, and/or other components. The signal can then be transmitted via an antenna, or the like.

In the illustrated transmitter circuit 100, and in many other types of circuit applications, it is desirable to maintain a fairly constant output power from the power amplifier 120 (e.g., for the power amplifier 122 produce a fairly constant gain). Often, however, the output power of such a power amplifier 120 can vary appreciably. For example, in some higher power applications, the output power of the power amplifier 120 can vary by multiple decibels, such that the amplified signal 125 level can vary by multiple volts (e.g., ±3 volts, or 6 volts peak-to-peak). Such a variation in output power can be undesirable in many applications. In some such cases, a power detector 130 is conventionally used in an attempt to regulate the output power of the power amplifier 120, thereby reducing the output power variation.

In the illustrated transmitter circuit 100, the power detector 130 senses the output of the power amplifier 120 (amplified signal 125). For example, the power detector can typically include a peak detector and/or a valley detector to detect a peak and/or valley of the amplified signal 125. The output of the power detector 130 (e.g., which may correspond to the peak and/or valley of the amplified signal 125) can be fed back as a feedback signal ($PD_{OUT}$) 135 to the radiofrequency signal generator 110. The radiofrequency signal generator 110 can use the feedback signal 135 to regulate the manner in which it generates the modulated signal 115 that is provided to the power amplifier 120. In this way, the power detector 130 can effectively regulate the output power of the power amplifier 122 within a permitted amount of variability.

Figure 2:
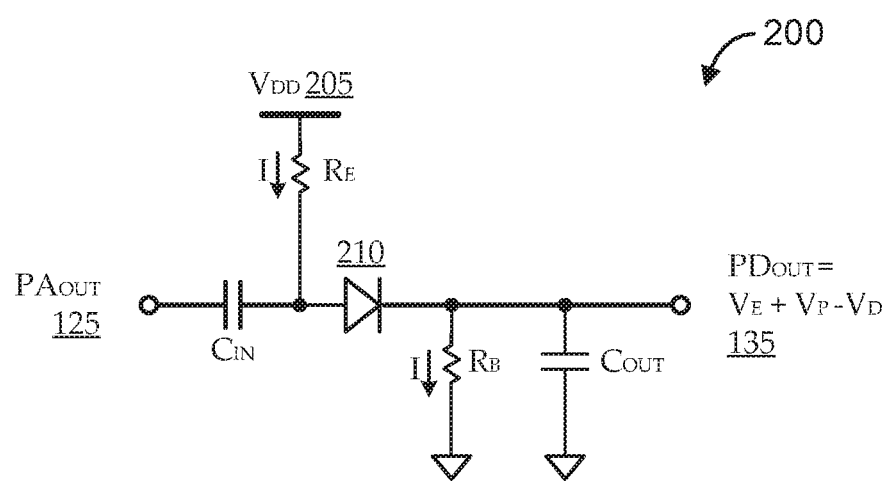
FIG. 2 shows a simplified circuit diagram of a conventional power detector circuit.

FIG. 2 shows a simplified circuit diagram of a conventional power detector circuit 200. The power detector circuit 200 receives an amplified signal 125 (e.g., the amplified signal 125 output by a power amplifier, as discussed with reference to FIG. 1), and generates a feedback signal 135 (e.g., the feedback signal 135 that is fed back to a radiofrequency signal generator, as discussed with reference to FIG. 1). The amplified signal 125 can be characterized as a modulating waveform riding on an average DC bias voltage ($V_E$). The power detector circuit 200 includes a diode 210 that effectively acts as a peak detector to detect a peak ($V_P$) of the amplified signal 125 received at its input. For example, the diode 210 is configured to turn on (e.g., to conduct) when the amplified signal 125 reaches, or approaches, a peak value, and to turn off (e.g., not to conduct) otherwise. Each time the diode 210 turns on, the output capacitor ($C_{OUT}$) can charge, such that the feedback signal 135 corresponds to the peak ($V_P$) of the amplified signal 125.

For example, the feedback signal 135 can be characterized as follows:

$$PD_{OUT} = V_E + V_P - V_D,$$

where $V_D$ is the voltage drop across the diode. As illustrated, when the diode 210 is conducting, a current path forms between a reference voltage terminal ($V_{DD}$ 205) and ground, with current passing through a first resistor ($R_E$), the diode 210, and a second resistor ($R_B$). Assuming the diode 210 is an ideal diode, the current (I) through the first and second resistors is the same. As such, the following voltage relationship can be defined:

$$V_{DD} = IR_E + V_D + IR_B.$$

Because $V_{DD}$, $R_E$, $V_D$, and $R_B$ can all be known values, it is trivial to compute the current (I). Further, it can be seen that the DC bias voltage (i.e., the average of the amplified signal 125, or $V_E$) can be characterized by:

$$V_E = V_{DD} - IR_E.$$

Thus, plugging in the computed current value enables computation of the DC bias voltage ($V_E$).

Notably, the above computations assume an ideal diode 210. While conventional power detector designs tend to rely on such an assumption, ultimate real-world implementations of such designs may not perform in accordance with those assumptions. In fact, power detectors are typically implemented using transistor technologies, such as CMOS; and it is typically difficult, if not impossible, to implement a pure (i.e., ideal) diode using such transistor technologies. When implemented in CMOS, the diode 210 acts less like a two-terminal device, and more like a three-terminal device. For example, the diode 210 tends to act like a bipolar junction transistor (BJT). While a pure diode does not tend to add any current gain to a current path, a BJT typically has a non-zero current gain, or β.

Figure 3:
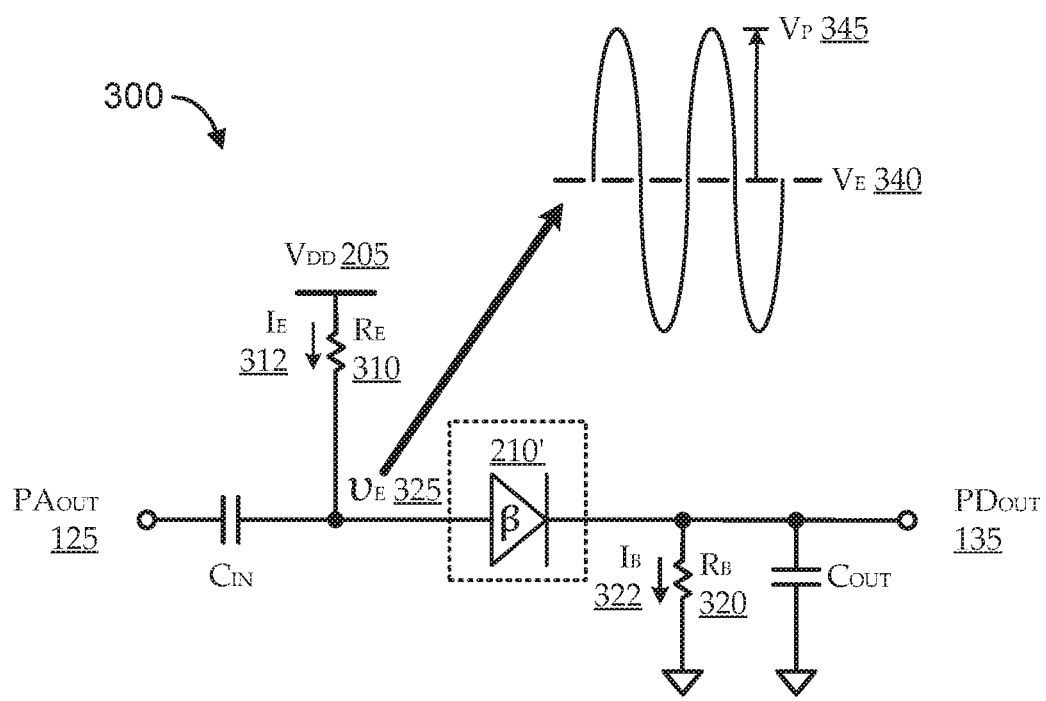
FIG. 3 shows another simplified circuit diagram of a conventional power detector circuit that is similar to the circuit of FIG. 2, but with a non-ideal diode.

FIG. 3 shows another simplified circuit diagram of a conventional power detector circuit 300 that is similar to the circuit 200 of FIG. 2, but with a non-ideal diode 210'. As with the circuit 200 of FIG. 2, the power detector circuit 300 receives an amplified signal 125 and generates a feedback signal 135. The received amplified signal 125 can be measured at the anode of the diode 210', labeled as time-varying signal ($\upsilon_E$) 325. The time-varying signal 325 may look as illustrated, having a waveform riding on an average bias voltage ($V_E$ 340), the waveform having a peak voltage level of $V_P$ 345. Thus:

$$\upsilon_{E\_PEAK}=V_E+V_P.$$

Applying the discussion from FIG. 2 above, an equation for the feedback signal 135 ($PD_{OUT}$) can be expressed as follows:

$$PD_{OUT}=V_E+V_P-V_D=\upsilon_{E_{PEAK}}-V_D.$$

Unlike in FIG. 2, the diode 210' in circuit 300 is non-ideal; the diode 210' has a non-zero current gain (i.e., β>0). When the diode 210' is conducting (e.g., when the signal at node $\upsilon_E$ 325 reaches, or approaches, the peak voltage level 345), the diode 210' adds current gain to the current path between the reference voltage terminal ($V_{DD}$ 205) and ground. Because of the added current gain, the current passing through a first resistor ($R_E$ 310) is different from the current passing through the second resistor ($R_B$ 320). The current passing through $R_E$ is labeled $I_E$ 312, and the current passing through $R_B$ is labeled $I_B$ 322.

From the circuit 300, it is clear that $V_E=V_{DD}-I_E R_E$. Substituting that into the above equation for $PD_{OUT}$ 135 yields:

$$PD_{OUT}=V_{DD}-I_E R_E+V_P-V_D$$

Further, for non-ideal diodes, it is known that:

$$I_E = (1+\beta)I_B = (1+\beta)\frac{PD_{OUT}}{R_B}.$$

Substituting this relationship into the preceding equation, the equation for $PD_{OUT}$ 135 can be rewritten as follows:

$$PD_{OUT} = \frac{V_{DD}+V_P-V_D}{1+(1+\beta)\frac{R_E}{R_B}}.$$

Notably, the above expression indicates that $PD_{OUT}$ 135 is dependent on β of the diode 210'.

It is typical in CMOS implementations of diodes that β is not constant. Rather, β tends to vary across process corners, temperature, and/or other real-world implementation conditions. In light of the above expression, variations in β over real-world implementation conditions can cause corresponding variations in $PD_{OUT}$ 135, thereby limiting the accuracy of the power detector (e.g., of circuit 300). In applications that rely on the power detector to maintain a fairly constant output power at the output of a power amplifier, such limitations in the accuracy of the power detector may be unacceptable. At least because conventional designs tend to assume a pure diode (e.g., because two-terminal diode components are typically used for circuit simulations of such designs), such designs tend not to appreciate the non-ideal nature of the transistor-implemented diode component, or the associated impacts of variations in β on the accuracy of such designs over real-world implementation conditions.

Embodiments described herein include a novel approach to implementing a power detector using transistors in a manner that accounts for the non-zero current gain of a transistor-implemented diode. Some embodiments arise from a novel recognition of the following relationship. As noted above, $$PD_{OUT}=V_E+V_P-D,$$

which can be rewritten as:

$$PD_{OUT}-V_E=V_P-V_D.$$

Thus, while $PD_{OUT}$ itself is dependent on β, $PD_{OUT}-V_E$ is not dependent on β (i.e., it is only dependent on $V_P$ and $V_D$). Accordingly, rather than using $PD_{OUT}$ 135 as the power detector output (e.g., as a measurement of peak output signal level of the output of a power amplifier), embodiments generate a power detector output in accordance with $PD_{OUT}-V_E$; such that the power detector output is not dependent on β and does not vary with variations in β.

Figure 4:
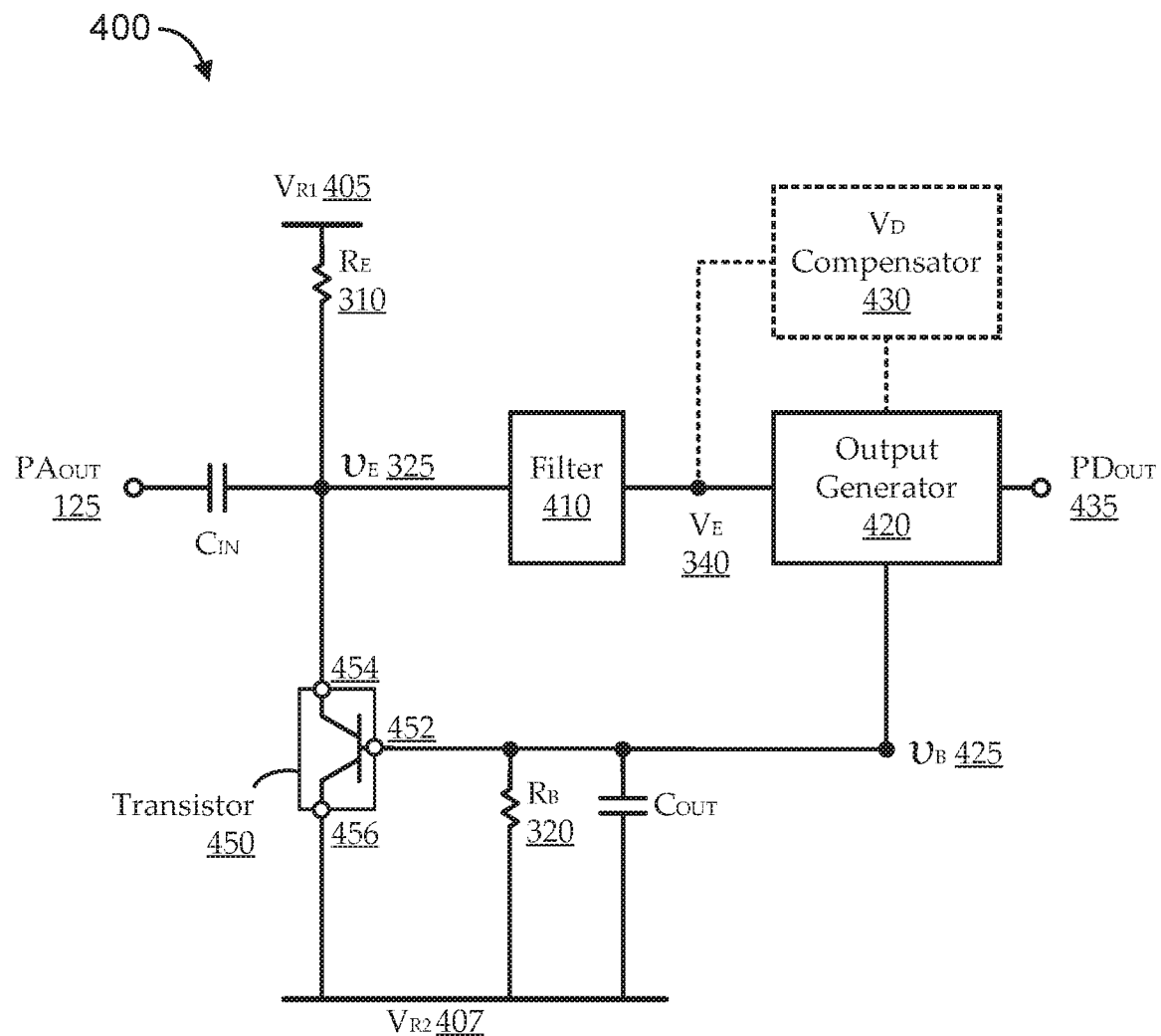
FIG. 4 shows a circuit diagram of an illustrative novel power detector circuit, according to various embodiments.

FIG. 4 shows a circuit diagram of an illustrative novel power detector circuit 400, according to various embodiments. As illustrated, the power detector circuit 400 receives an amplified signal 125 (e.g., from the output of a power amplifier) and generates a power detector output signal ($PD_{OUT}$) 435 (e.g., which may be used as an implementation of the feedback signal 135 of FIG. 1). As illustrated in context of FIG. 3 above, the received amplified signal 125 can be a waveform riding on an average bias voltage and having a peak voltage level. The amplified signal 125 can be measured as time-varying signal ($\upsilon_E$) 325 at an emitter terminal 454 of a transistor 450 (e.g., a bipolar junction transistor). The peak of $\upsilon_E$ can be characterized as $V_E+V_P$, and the valley of $\upsilon_E$ can be characterized as $V_E-V_P$; where $V_E$ is the average bias voltage of $\upsilon_E$, and $V_P$ is the peak voltage level of $\upsilon_E$.

The illustrated power detector circuit 400 can be designed as either a peak detector or as a valley detector. As a peak detector, a non-ideal diode implemented by a transistor 450 turns on when the amplified signal 125 reaches (or approaches) the peak voltage, and turns off otherwise. For example, in such a configuration, a first reference level ($V_{R1}$) 405 is coupled with a positive supply voltage, and a second reference level ($V_{R2}$) 407 is coupled with a ground reference; and a source terminal of the transistor 450 is coupled with $V_{R2}$ 407 (i.e., with ground). When the transistor 450 turns on in such a configuration, a current path forms between $V_{R1}$ 405 and $V_{R2}$ 407 through resistors $R_E$ 310 and $R_B$ 320. As a valley detector, the non-ideal diode implemented by the transistor 450 turns on when the amplified signal 125 reaches (or approaches) the valley voltage, and turns off otherwise. In such a configuration, $V_{R1}$ 405 can be coupled with the ground reference, and $V_{R2}$ 407 can be coupled with the positive supply voltage; and the source terminal of the transistor 450 is coupled with $V_{R2}$ 407 (i.e., with the positive supply voltage). When the transistor 450 turns on in such a valley detector configuration, a current path forms between $V_{R2}$ 407 and $V_{R1}$ 405 through resistors $R_B$ 320 and $R_E$ 310.

As described above, the transistor 450 has a non-zero current gain (β), such that it adds current gain when it is conducting. For example, in a peak detector configuration, in accordance with the equations derived above, the voltage signal at the base of the BJT 450 (labeled $\upsilon_B$ 425) can be expressed as follows:

$$\upsilon_B = \frac{V_{DD}+V_P-V_D}{1+(1+\beta)\frac{R_E}{R_B}}.$$

As illustrated, embodiments of the circuit 400 include a filter 410. The filter 410 can include any suitable components to effectively extract an average of the $v_E$ 325 signal, labeled as $V_E$ 340 at the output of the filter 410. For example, the filtered 410 can include a low-pass filter, which effectively passes through the DC bias of the $v_E$ 325 signal, which corresponds to $V_E$ 340. As described above, while $v_B$ 425 alone is dependent on β, the difference between $v_B$ 425 and $V_E$ 340 does not depend on β. Thus, the different can be characterized as:

$$v_B - V_E = V_P - V_D$$

for a peak detector implementation, or as:

$$V_E - v_B = V_P - V_D$$

for a valley detector implementation. Thus, embodiments of the circuit 400 include an output generator 420 to generate a power detector output ($PD_{OUT}$) 435 in accordance with the above relationship that does not depend on β. For example, the output generator 420 includes circuitry that computes a difference between $v_B$ 425 and $V_E$ 340. In accordance with the above, such a difference can equal the peak voltage of $v_E$ 325 ($V_P$) less an effective diode voltage ($V_D$) corresponding to a voltage drop between the emitter and base terminals of the transistor 450.

In some embodiments, it is desirable to compensate for (e.g., calibrate out) the effective diode voltage. For example, in accordance with the above relationship, the power detector output 435 can be made to correspond directly to the peak voltage of $v_E$ 325 ($V_P$) by adding the effective diode voltage to both sides of the equation. However, the effective diode voltage may not be known. Thus, embodiments of the circuit 400 further include a diode voltage compensator 430. The diode voltage compensator 430 can include any suitable circuitry to determine the effective diode voltage, thereby enabling compensation for the effective diode voltage at the output of the circuit 400.

In some embodiments, the circuit 400 is driven without a time-varying signal at one or more times. For example, at some particular time or times (e.g., as part of a startup routine, periodically, and/or at any other suitable time when a time-varying signal is not being received), the amplified signal 125 received at the input of the circuit 400 is substantially a DC signal, such as a signal corresponding to $V_E$ 340. Without any time-variance, $V_P$ is substantially zero; such that the effective diode voltage ($V_D$) is substantially equal to $v_B$ 425 less $V_E$ 340 (in accordance with the above relationship). In such embodiments, the diode voltage compensator 430 can include a memory, which stores the effective diode voltage value measured during the particular time or times. For example, during normal operation, when the amplified signal 125 is a time-varying signal (i.e., $V_P$ is non-zero), the value for the effective diode voltage that is stored in the memory of the diode voltage compensator 430 can be used by the output generator 420 to generate a power detector output 435 that directly corresponds to the peak voltage ($V_P$) of $v_E$ 325.

In other embodiments, the diode voltage compensator 430 includes a replica circuit. The replica circuit can act effectively as a replica of some or all of the rest of circuit 400, except that the replica circuit is driven by a reference signal that is not time-varying. In some implementations, the replica circuit is driven by the output of the filter 410 (i.e., $V_E$ 340). As described above, without any time-variance, $V_P$ is substantially zero; such that the effective diode voltage ($V_D$) is substantially equal to $v_B$ 425 less $V_E$ 340. Thus, the output of the replica circuit (i.e., the output of the diode voltage compensator 430) corresponds to the effective diode voltage, and can be fed to the output generator 420 for use in generating a power detector output 435 that directly corresponds to the peak voltage ($V_P$) of $v_E$ 325.

Figure 5A:
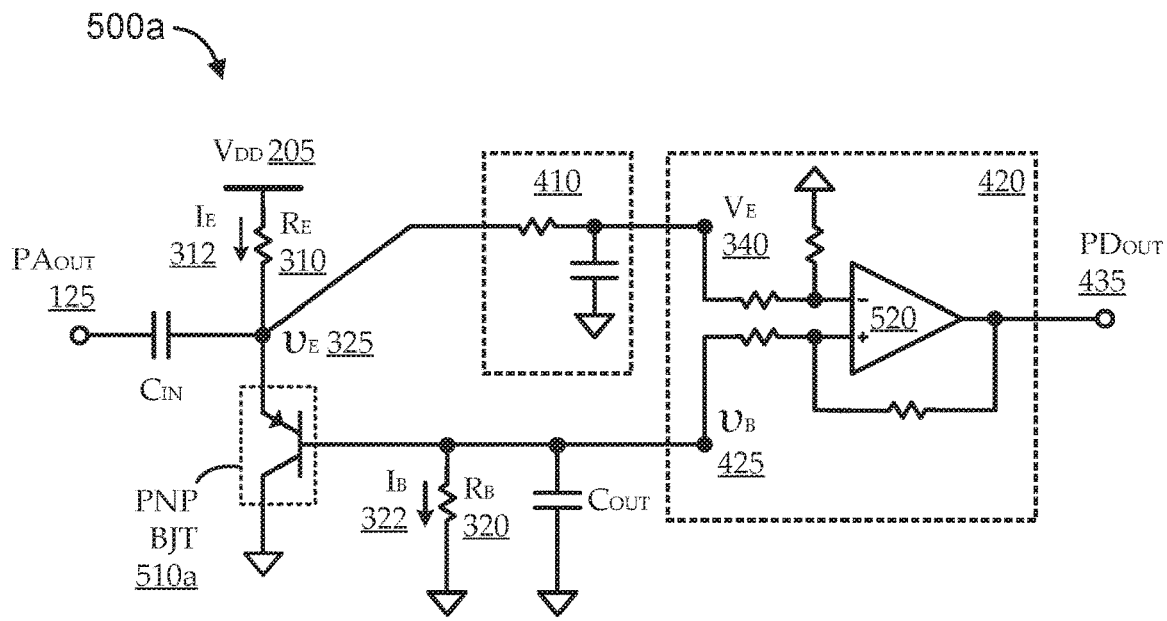
FIGS. 5A and 5B show circuit diagrams of different implementations of power detector circuits, according to various embodiments.
Figure 5B:
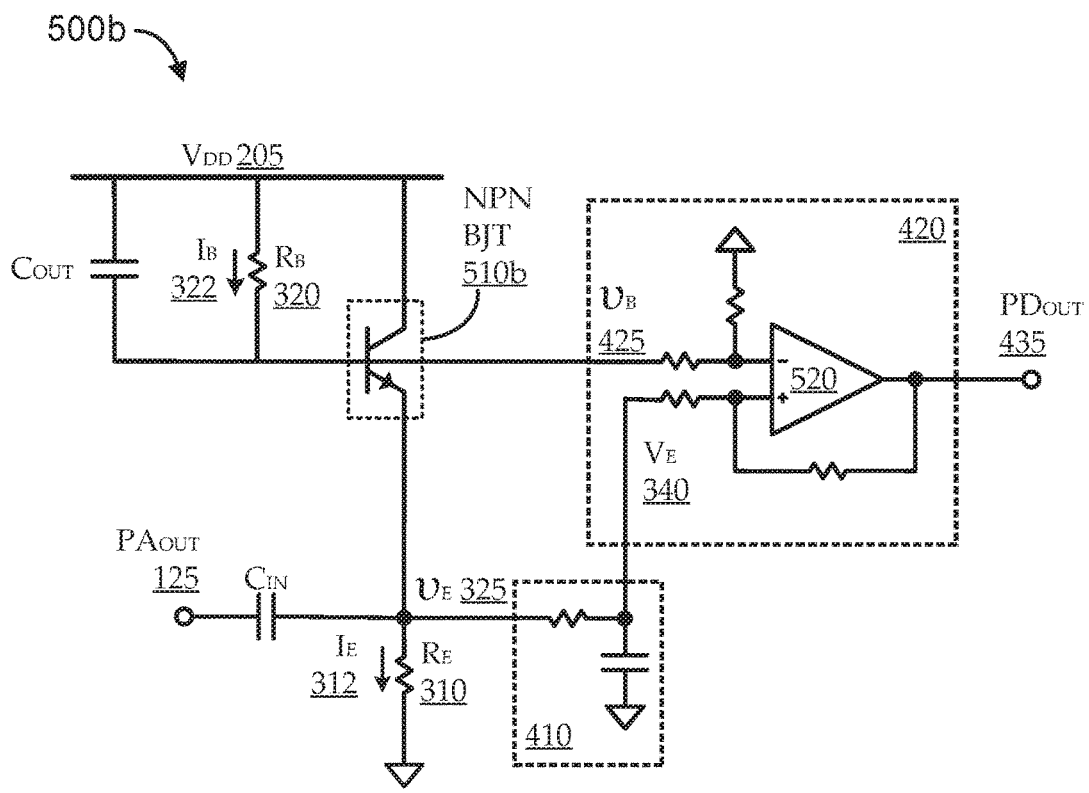

FIGS. 5A and 5B show circuit diagrams of different implementations of power detector circuits 500, according to various embodiments. Turning first to FIG. 5A, the power detector circuit 500a can be an implementation of the circuit 400 described above with reference to FIG. 4. In particular, the power detector circuit 500a uses a PNP BJT 510a as a peak detector. A power detector output 435 can be generated as a function of measuring a time-varying voltage signal at a base terminal of the PNP BJT 510a (indicated as $v_B$ 425) and measuring a time-varying voltage signal at an emitter terminal of the PNP BJT 510a (indicated as $v_E$ 325). As illustrated, generation of the power detector output 435 is aided by a filter 410 and an output generator 420. The illustrated filter 410 is a low-pass filter, implemented using an in-line resistor, and a capacitor tied to ground. The output of the low-pass filter is effectively $V_E$ 340, as described above. The output signal generator 420 is implemented as a differential difference amplifier circuit. As illustrated, the output signal generator 420 receives $V_E$ 340 and $v_B$ 425 as differential inputs to an operational amplifier 520 configured as a difference amplifier, such that the output of the operational amplifier 520 is effectively $v_B$ 425 less $V_E$ 340. In some implementations, as illustrated, the output of the operational amplifier 520 is the power detector output 435. In other implementations, further processing can be performed, for example, to compensate for the effective diode voltage.

Turning to FIG. 5B, the power detector circuit 500b can be implemented as a valley detector circuit. In particular, the power detector circuit 500b uses an NPN BJT 510b as a valley detector. Operation of valley detector circuit implementations can be similar to that of peak detector circuit implementations, such as those described above; except that the NPN BJT 510b is configured to conduct only when the amplified signal 125 is at or near a valley (e.g., as opposed to conducting only when the amplified signal 125 is at or near a peak). Still, a power detector output 435 can be generated as a function of measuring a time-varying voltage signal at an base terminal of the NPN BJT 510b (indicated as $v_B$ 425) and measuring a time-varying voltage signal at an emitter terminal of the NPN BJT 510b (indicated as $v_E$ 325); and generation of the power detector output 435 is aided by a filter 410 and an output generator 420. As in FIG. 5A, the illustrated filter 410 FIG. 5B is a low-pass filter, implemented using an in-line resistor, and a capacitor tied to ground; such that its output is effectively $V_E$ 340. Further, as in FIG. 5A, the output signal generator 420 is implemented as a differential difference amplifier circuit that receives $V_E$ 340 and $v_B$ 425 as differential inputs to an operational amplifier 520 configured as a difference amplifier. Unlike in FIG. 5A, however, the operational amplifier 520 is configured such that its output is effectively $V_E$ 340 less $v_B$ 425. For example, in the circuit 500b, $v_B$ 425 can be characterized as:

$$v_B = V_D + v_{E\_VALLEY} = V_D V_E - V_P,$$

such that:

$$V_E - v_B = V_P - V_D.$$

As with FIG. 5A, some implementations can use the output of the operational amplifier 520 directly as the power detector output 435, while other implementations can perform further processing (e.g., to compensate for the effective diode voltage).

Figure 6:
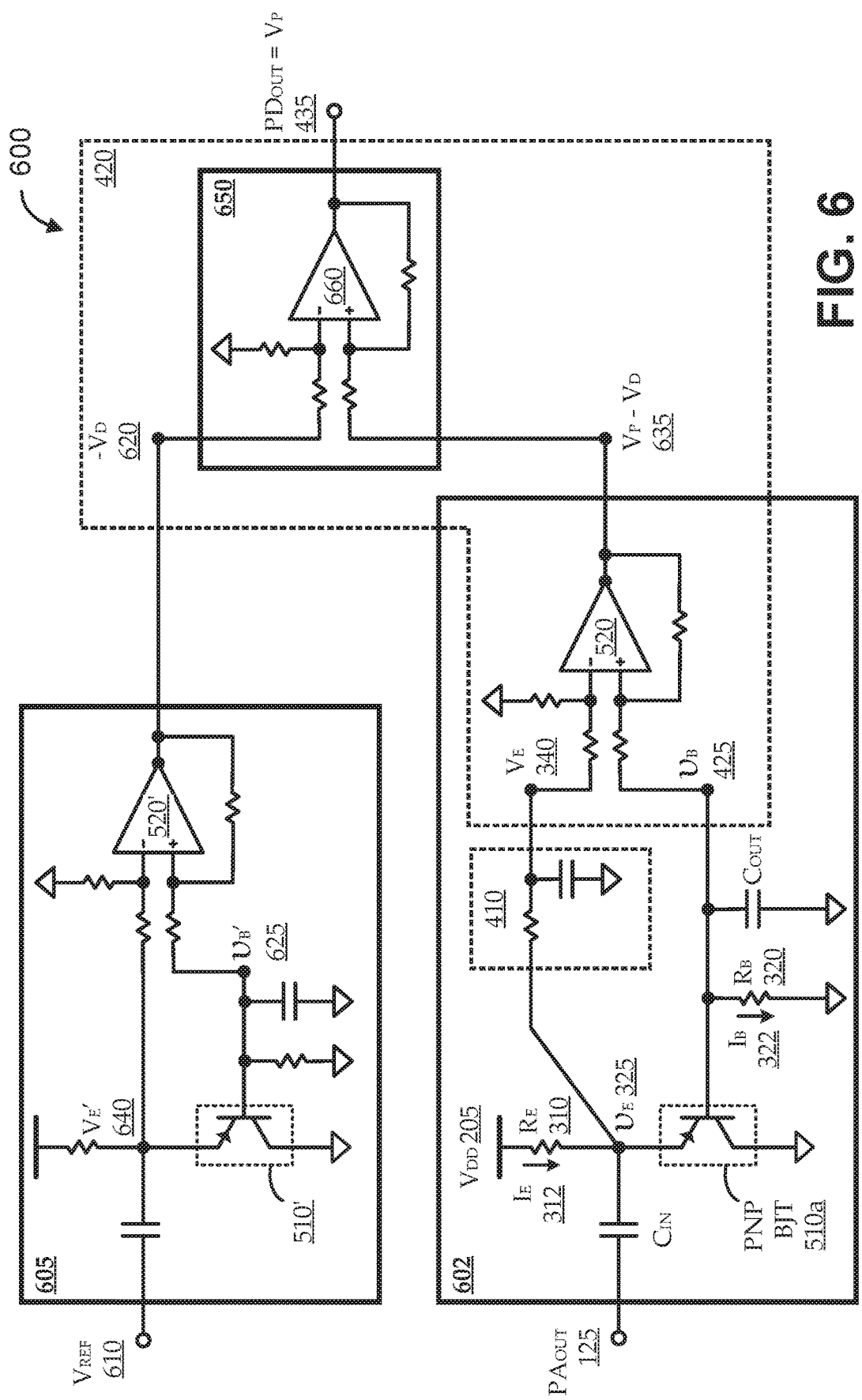
FIG. 6 shows a circuit diagram of another implementation of a power detector circuit that includes compensation, according to various embodiments.

FIG. 6 shows a circuit diagram of another implementation of a power detector circuit 600 that includes compensation, according to various embodiments. The power detector circuit 600 includes a primary power detector circuit 602 and a replica circuit 605. The illustrated power detector circuit 600 is implemented in accordance with the circuit 500a described above with reference to FIG. 5A. However, the power detector circuit 600 can similarly be implemented using any other suitable embodiments of power detector circuits described herein (e.g., those implemented using a peak detector architecture, a valley detector architecture, etc.). As described above, the primary power detector circuit 602 receives an amplified signal 125. It is assumed that the amplified signal 125 is a time-varying signal, at least some of the time. Accordingly, the output of the primary power detector circuit 602 (labeled as node 635) is effectively the peak voltage ($V_P$) of $v_E$ 325 less an effective diode voltage ($V_D$) corresponding to a voltage drop between the emitter and base terminals of the BJT 510a in the primary power detector circuit 602.

The input to the replica circuit 605 can be any suitable reference voltage signal 610 that is not time-varying. In some implementations, the reference voltage signal 610 is tied to $V_E$ 340, such that the input to the replica circuit 605 corresponds to the average value of $v_E$ 325, as measured by the primary power detector circuit 602. Because the reference voltage signal 610 is not time-varying, replica circuit 605 may not include a filter, and the bias voltage signal used by the replica circuit 605 (labeled as $V_E'$ 640) can effectively be the same as the reference voltage signal 610. As such, the output of the replica circuit 605 can correspond directly to the effective diode voltage. In particular, the output of the replica circuit 605, indicated as node 620, can be characterized as $-V_D$.

The output of the primary power detector circuit 602 (node 635) and the output of the replica circuit 605 (node 620) can be passed to an additional output circuit 650. As illustrated, the additional output circuit 650 can be implemented as another differential difference amplifier. The additional output circuit 650 can have an operational amplifier 660 that takes the outputs of the primary power detector circuit 602 and the replica circuit 605 as its differential inputs, and generates the power detector output signal 435 as the difference between those differential inputs. In particular, as illustrated, the output of the additional output circuit 650 can be characterized as follows:

$$PD_{OUT}=V_P-V_D-(-V_D)=V_P.$$

Figure 7:
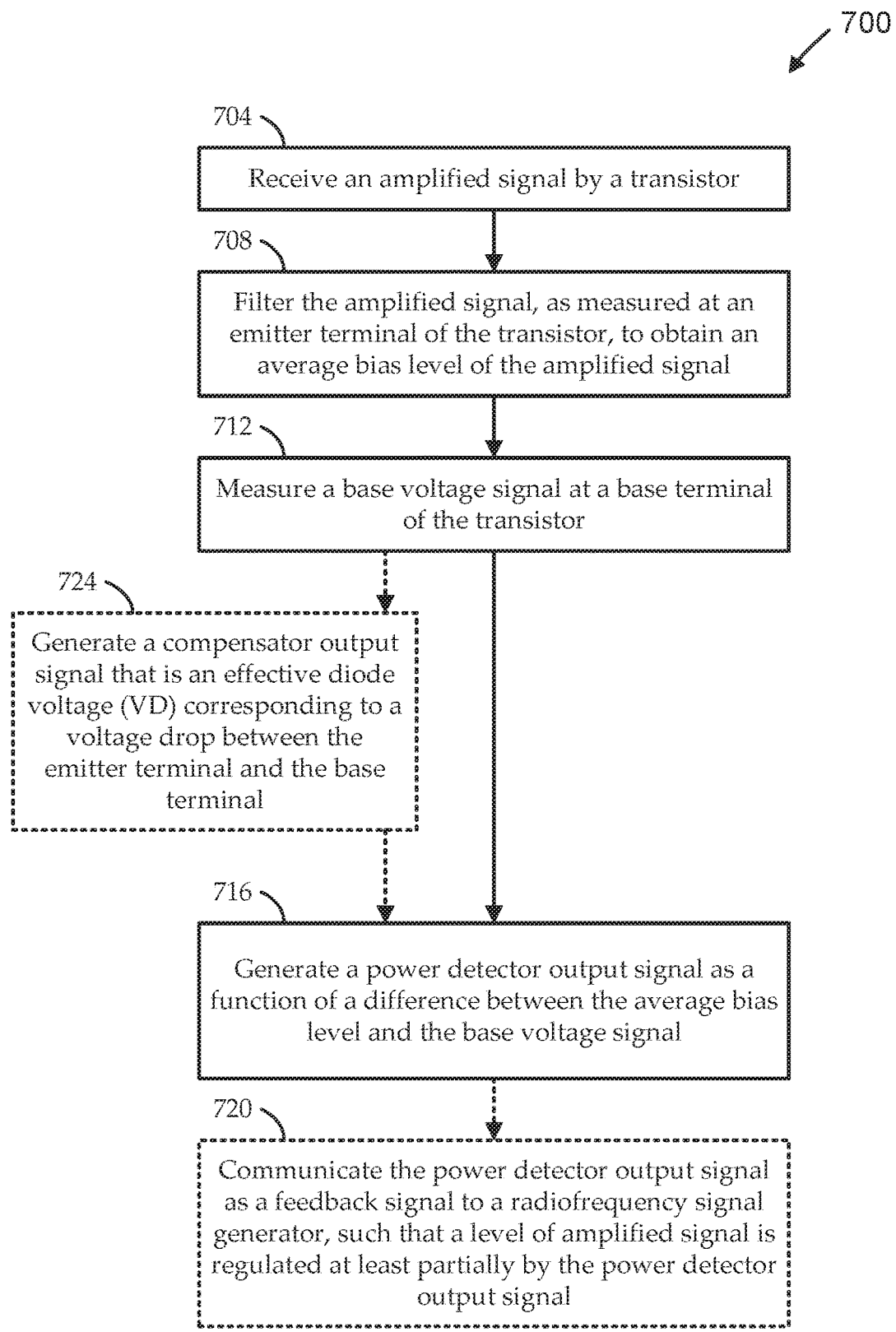
FIG. 7 shows a flow diagram of an illustrative method for power detection of an amplified signal, according to various embodiments.

FIG. 7 shows a flow diagram of an illustrative method 700 for power detection of an amplified signal, according to various embodiments. Embodiments of the method 700 begin at stage 704 by receiving an amplified signal by a transistor. At stage 708, embodiments can filter the amplified signal, as measured at an emitter terminal of the transistor, to obtain an average bias level of the amplified signal. At stage 712, embodiments can measure a base voltage signal at a base terminal of the transistor. At stage 716, embodiments can generate a power detector output signal as a function of a difference between the average bias level and the base voltage signal. In some implementations, the transistor is configured to detect a valley of the amplified signal, and the generating at stage 716 includes subtracting the average bias level from the base voltage signal. In other implementations, the transistor is configured to detect a peak of the amplified signal, and the generating includes subtracting the base voltage signal from the average bias level.

In some embodiments, the method 700 further generates a compensator output signal, at stage 724, that is an effective diode voltage ($V_D$) corresponding to a voltage drop between the emitter terminal and the base terminal. In such embodiments, the generating of the power detector output signal at stage 716 can further include compensating for $V_D$ as a function of the compensator output signal, such that the power detector output signal corresponds to a peak voltage level ($V_P$) of the amplified signal. For example, without the compensation, the power detector output signal is characterized as $V_P-V_D$; and with compensation, the power detector output signal is characterized as $V_P$. In some such embodiments, generating the compensator output signal at stage 724 includes measuring the power detector output signal, when the amplified signal is not a time-varying signal, to generate a measured power detector output signal that corresponds to $V_D$; and storing the measured power detector output signal to a memory. Compensating for $V_D$ as a function of the compensator output signal can then include retrieving the measured power detector output signal from the memory. In other such embodiments, generating the compensator output signal at stage 724 includes receiving a reference bias signal, the reference bias signal being a non-time-varying signal; measuring a replica base voltage signal at a replica base terminal of a replica device configured to replicate the transistor; and generating a replica output signal as a function of a difference between the reference bias signal and the replica base voltage signal. For example, the reference bias signal is the average bias level. In some embodiments that include the generating at stage 724, generating the power detector output signal at stage 716 includes: generating an intermediate output signal as a function of the difference between the average bias level and the base voltage signal, such that the intermediate output signal is characterized by a peak voltage level ($V_P$) of the amplified signal less $V_D$; and generating the power detector output signal as a function of the intermediate output signal and the compensator output signal, such that the power detector output signal corresponds to $V_P$.

In some embodiments, the amplified signal is received at stage 704 from an output of a power amplifier that amplifies a signal generated by a radiofrequency signal generator. In such embodiments, the method 700 can communicate the power detector output signal, at stage 720, as a feedback signal to the radiofrequency signal generator. For example, the feedback can be, such that a level of the output of the power amplifier is regulated at least partially by the power detector output signal.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc, may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A power detector system comprising:
   a signal input node to receive an amplified signal;
   a transistor having a base terminal, an emitter terminal, and a source terminal, the emitter terminal coupled with the signal input node;
   a filter having a filter input node and a filter output node, the filter input node coupled with the emitter node to generate a filter output signal at the filter output node that corresponds to an average bias level of the amplified signal; and
   an output generator having a first generator input node coupled with the base terminal, a second generator input node coupled with the filter output node, and a generator output node to output a power detector output signal generated as a function of a difference between the first generator input node and the second generator input node.

2. The power detector system of claim 1, wherein:
   the transistor is an PNP bipolar junction transistor;
   the source terminal is coupled with a ground reference level; and
   the power detector output signal is generated as a function of the first generator input node less the second generator input node.

3. The power detector system of claim 1, wherein:
   the transistor is an NPN bipolar junction transistor;
   the source terminal is coupled with a positive supply reference level; and
   the power detector output signal is generated as a function of the second generator input node less the first generator input node.

4. The power detector system of claim 1, further comprising:
   a diode voltage compensator to generate, at a compensator output node, a compensator output signal that is an effective diode voltage ($V_D$) corresponding to a voltage drop between the emitter terminal and the base terminal,
   wherein the output generator comprises a third generator input node coupled with the compensator output node, and
   power detector output signal is generated further as a function of the compensator output signal, such that the power detector output signal corresponds to a peak voltage level ($V_P$) of the amplified signal.

5. The power detector system of claim 4, wherein:
   the diode voltage compensator comprises a memory to store the measured power detector output signal;
   the diode voltage compensator is configured to operate selectively in one of a measurement mode or a normal operating mode;
   when the diode voltage compensator is in the measurement mode, the amplified signal is not a time-varying signal, and the diode voltage compensator is to measure the power detector output signal to generate a measured power detector output signal that corresponds to $V_D$, and to store the measured power detector output signal to the memory; and
   when the diode voltage compensator is in the normal operating mode, the diode voltage compensator is to generate the compensator output signal at the compensator output node according to the measured power detector output signal stored in the memory.

6. The power detector system of claim 4, wherein:
   the diode voltage compensator comprises a replica circuit having:
   a replica input node to receive a reference bias signal;
   a replica transistor having a replica base terminal, a replica emitter terminal, and a replica source terminal, the replica emitter terminal coupled with the replica input node;
   a replica output generator to output a replica output signal generated as a function of a difference between a voltage at the replica base terminal and the reference bias signal.

7. The power detector system of claim 6, wherein:
   the replica input node is coupled with the filter output node.

8. The power detector system of claim 4, wherein the output generator comprises:
   a first difference amplifier to generate an intermediate output signal as a function of the first generator input node and the second generator input node, such that the intermediate output signal is characterized by a peak voltage level ($V_P$) of the amplified signal less an effective diode voltage ($V_D$) that corresponds to a voltage drop between the emitter terminal and the base terminal; and
   a second difference amplifier to generate the power detector output signal as a function of the intermediate output signal and the compensator output signal, such that the power detector output signal corresponds to $V_P$.

9. The power detector system of claim 1, wherein:
the amplified signal comprises a time-varying signal; and
the filter is a low-pass filter to output the average bias level of the amplified signal.

10. The power detector system of claim 1, wherein:
the output generator comprises a differential difference amplifier; and
the first generator input node and the second generator input node are differential input nodes of the differential difference amplifier.

11. A radiofrequency transmitter system comprising a power amplifier coupled with the power detector system of claim 1, wherein:
the power amplifier generates the amplified signal by applying an amount of gain to a radiofrequency signal, the amount of gain regulated at least partially in accordance with the power detector output signal.

12. A method for power detection of an amplified signal, the method comprising:
receiving an amplified signal by a transistor;
filtering the amplified signal, as measured at an emitter terminal of the transistor, to obtain an average bias level of the amplified signal;
measuring a base voltage signal at a base terminal of the transistor; and
generating a power detector output signal as a function of a difference between the average bias level and the base voltage signal.

13. The method of claim 12, wherein the amplified signal is received from an output of a power amplifier that amplifies a signal generated by a radiofrequency signal generator, and further comprising:
communicating the power detector output signal as a feedback signal to the radiofrequency signal generator, such that a level of the output of the power amplifier is regulated at least partially by the power detector output signal.

14. The method of claim 12, wherein:
the transistor is configured to detect a valley of the amplified signal; and
the generating comprises subtracting the average bias level from the base voltage signal.

15. The method of claim 12, wherein:
the transistor is configured to detect a peak of the amplified signal; and
the generating comprises subtracting the base voltage signal from the average bias level.

16. The method of claim 12, further comprising:
generating a compensator output signal that is an effective diode voltage ($V_D$) corresponding to a voltage drop between the emitter terminal and the base terminal,
wherein generating the power detector output signal further comprises compensating for $V_D$ as a function of the compensator output signal, such that the power detector output signal corresponds to a peak voltage level ($V_P$) of the amplified signal.

17. The method of claim 16, wherein generating the compensator output signal comprises:
measuring the power detector output signal, when the amplified signal is not a time-varying signal, to generate a measured power detector output signal that corresponds to $V_D$; and
storing the measured power detector output signal to a memory,
wherein compensating for $V_D$ as a function of the compensator output signal comprises retrieving the measured power detector output signal from the memory.

18. The method of claim 16, wherein generating the compensator output signal comprises:
receiving a reference bias signal, the reference bias signal being a non-time-varying signal;
measuring a replica base voltage signal at a replica base terminal of a replica device configured to replicate the transistor; and
generating a replica output signal as a function of a difference between the reference bias signal and the replica base voltage signal.

19. The method of claim 18, wherein the reference bias signal is the average bias level.

20. The method of claim 16, wherein generating the power detector output signal comprises:
generating an intermediate output signal as a function of the difference between the average bias level and the base voltage signal, such that the intermediate output signal is characterized by a peak voltage level ($V_P$) of the amplified signal less an effective diode voltage ($V_D$) that corresponds to a voltage drop between the emitter terminal and the base terminal; and
generating the power detector output signal as a function of the intermediate output signal and the compensator output signal, such that the power detector output signal corresponds to $V_P$.

* * * * *